United States Patent
Li et al.

(10) Patent No.: US 9,870,918 B2
(45) Date of Patent: Jan. 16, 2018

(54) INGAAS FILM GROWN ON SI SUBSTRATE AND METHOD FOR PREPARING THE SAME

(71) Applicant: SOUTH CHINA UNIVERSITY OF TECHNOLOGY, Guangzhou, Guangdong Province (CN)

(72) Inventors: Guoqiang Li, Guangzhou (CN); Fangliang Gao, Guangzhou (CN); Yunfang Guan, Guangzhou (CN); Lei Wen, Guangzhou (CN); Jingling Li, Guangzhou (CN); Shuguang Zhang, Guangzhou (CN)

(73) Assignee: SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 15/026,726

(22) PCT Filed: Dec. 5, 2014

(86) PCT No.: PCT/CN2014/093143
§ 371 (c)(1),
(2) Date: Apr. 1, 2016

(87) PCT Pub. No.: WO2015/106608
PCT Pub. Date: Jul. 23, 2015

(65) Prior Publication Data
US 2016/0218006 A1 Jul. 28, 2016

(30) Foreign Application Priority Data
Jan. 15, 2014 (CN) .......................... 2014 1 0018708

(51) Int. Cl.
*H01L 21/02* (2006.01)
*H01L 31/0304* (2006.01)
(Continued)

(52) U.S. Cl.
CPC ...... *H01L 21/02546* (2013.01); *C30B 25/183* (2013.01); *C30B 29/42* (2013.01);
(Continued)

(58) Field of Classification Search
CPC ...................... H01L 21/02381; H01L 21/0254
(Continued)

(56) References Cited

U.S. PATENT DOCUMENTS

| 4,455,351 A | * | 6/1984 | Camlibel | ............ H01L 21/3185 257/189 |
| 5,543,354 A | * | 8/1996 | Richard | ................. B82Y 20/00 117/105 |

(Continued)

FOREIGN PATENT DOCUMENTS

| CN | 103346092 A | 10/2013 |
| CN | 103762256 A | 4/2014 |

OTHER PUBLICATIONS

Feb. 11, 2015 Search Report issued in International Application No. PCT/CN2014/093143.

*Primary Examiner* — Jami M Valentine
(74) *Attorney, Agent, or Firm* — Oliff PLC

(57) ABSTRACT

The present invention discloses an InGaAs film grown on a Si substrate, which comprises a Si substrate, a low temperature $In_{0.4}Ga_{0.6}As$ buffer layer, a high temperature $In_{0.4}Ga_{0.6}As$ buffer layer and an $In_{0.53}Ga_{0.47}As$ epitaxial film, arranged sequentially, wherein the low temperature $In_{0.4}Ga_{0.6}As$ buffer layer is an $In_{0.4}Ga_{0.6}As$ buffer layer grown at the temperature of 350~380° C.; the high temperature $In_{0.4}Ga_{0.6}As$ buffer layer is an $In_{0.4}Ga_{0.6}As$ buffer layer grown at the temperature of 500~540° C., and the sum of the thickness of the low temperature $In_{0.4}Ga_{0.6}As$ buffer layer and the thickness of the high temperature $In_{0.4}Ga_{0.6}As$ buffer layer is 10~20 nm. The invention further discloses a method for preparing the InGaAs film. The InGaAs film
(Continued)

grown on the Si substrate of the present invention has good crystal quality, is almost completely relaxed, and has a simple preparation process.

6 Claims, 2 Drawing Sheets

(51) Int. Cl.
    *H01L 31/18*     (2006.01)
    *C30B 25/18*     (2006.01)
    *C30B 29/42*     (2006.01)
    *H01L 29/201*     (2006.01)

(52) U.S. Cl.
    CPC .... *H01L 21/02052* (2013.01); *H01L 21/0262* (2013.01); *H01L 21/02381* (2013.01); *H01L 21/02433* (2013.01); *H01L 21/02463* (2013.01); *H01L 21/02502* (2013.01); *H01L 21/02631* (2013.01); *H01L 21/02658* (2013.01); *H01L 31/03046* (2013.01); *H01L 31/1848* (2013.01); *H01L 31/1852* (2013.01); *H01L 29/201* (2013.01); *Y02E 10/544* (2013.01)

(58) Field of Classification Search
    USPC ............................................ 257/190; 438/22
    See application file for complete search history.

(56) References Cited

U.S. PATENT DOCUMENTS

| | | | | |
|---|---|---|---|---|
| 5,573,960 | A * | 11/1996 | Izumi | H01L 21/6835 148/DIG. 12 |
| 5,850,408 | A * | 12/1998 | Ouchi | B82Y 20/00 372/27 |
| 7,842,595 | B2 | 11/2010 | Sauer et al. | |
| 2003/0098477 | A1 | 5/2003 | Nambu et al. | |
| 2013/0240835 | A1* | 9/2013 | Takahashi | H01L 31/035236 257/15 |

* cited by examiner

INGAAS FILM GROWN ON SI SUBSTRATE AND METHOD FOR PREPARING THE SAME

TECHNICAL FIELD

The present invention relates to InGaAs film and a method for preparing the same, particularly to an InGaAs film grown on a Si substrate and a method for preparing the same.

BACKGROUND

The III-V group compounds are widely applied in the photoelectric devices due to the advantages, such as good stability, low effective mass, high electron mobility and peak velocity, high light absorption coefficient, etc. Among these, the band gaps of the $In_xGa_{1-x}As$ ($0 \leq x \leq 1$) materials can vary in the range of 0.35 eV (InAs)~1.43 eV (GaAs) with the changes of the In components. According to these characteristics, the $In_xGa_{1-x}As$ materials, particularly the $In_{0.53}Ga_{0.47}As$ material with the in component of 0.53, can be applied in the room temperature infrared detectors and the highly efficient tandem solar cells.

InP, GaAs and Si are commonly used as the substrate for epitaxially growing the $In_{0.53}Ga_{0.47}As$ material. But InP and GaAs are expensive, small in wafer size, and brittle, which are not beneficial to the industrial production. As compared with the InP or GaAs substrate, the Si substrate is inexpensive, and easy to operate in large size. At the same time, most of the integrated chips on the present market are Si-based, therefore growing an $In_{0.53}Ga_{0.47}As$ film on Si facilitates integrating the same into the existing chips. However, as there are large lattice mismatches (≈9%) between the Si and the $In_{0.53}Ga_{0.47}As$ material, if $In_{0.53}Ga_{0.47}As$ is directly grown on the Si, a large amount of residual stress will occur in the obtained film. And large residual stress will have a great effect on the properties of the $In_{0.53}Ga_{0.47}As$ film. On one hand, large residual stress may cause crackles or even cracks on the $In_{0.53}Ga_{0.47}As$ film during its growth. On the other hand, large residual stress will cause a large amount of defects in the $In_{0.53}Ga_{0.47}As$ film, thus deteriorating the device performance. In order to grow an $In_{0.53}Ga_{0.47}As$ material with a high quality on the Si substrate, the best way is that first a buffer layer material is epitaxially grown on the Si substrate to release the stress, then the $In_{0.53}Ga_{0.47}As$ material is epitaxially grown. But in the growth of $In_{0.53}Ga_{0.47}As$ at present, the most used are the multilayer buffer layer structures with graded buffer layer, step-graded buffer layer, invert-graded buffer layer, and the like, which often result in that it is necessary to epitaxially grow the multiple thick buffer layers before growing the $In_{0.53}Ga_{0.47}As$ material, and the growth steps are complicated and it is difficult to precisely control the constituent, thickness, and crystal quality of each layer of the materials, thus affecting the quality of the finally obtained $In_{0.53}Ga_{0.47}As$ film. Therefore, in order to obtain an $In_{0.53}Ga_{0.47}As$ film with low residual stress and high quality, it is required to optimize the growth process of the buffer layer.

SUMMARY OF THE INVENTION

In order to overcome the above disadvantages and deficiencies in the prior art, an object of the invention is to provide an InGaAs film grown on a Si substrate, which film has a good crystal quality, and almost completely relaxed.

Another object of the present invention is to provide a method for preparing the above-mentioned InGaAs film grown on the Si substrate, and by using this method, the resulting $In_{0.53}Ga_{0.47}As$ epitaxial film prepared on the Si substrate has a good crystal quality and is almost completely relaxed, and at the same time, the growth process of the film material is significantly simplified.

The objects of the present invention are achieved by the following technical solutions:

The InGaAs film grown on the Si substrate comprises the Si substrate, the low temperature $In_{0.4}Ga_{0.6}As$ buffer layer, the high temperature $In_{0.4}Ga_{0.6}As$ buffer layer and the $In_{0.53}Ga_{0.47}As$ epitaxial film, arranged sequentially, wherein the low temperature $In_{0.4}Ga_{0.6}As$ buffer layer is an $In_{0.4}Ga_{0.6}As$ buffer layer grown at 350~380° C.; the high temperature $In_{0.4}Ga_{0.6}As$ buffer layer is an $In_{0.4}Ga_{0.6}As$ buffer layer grown at 500~540° C.; and the sum of the thickness of the low temperature $In_{0.4}Ga_{0.6}As$ buffer layer and the thickness of the high temperature $In_{0.4}Ga_{0.6}As$ buffer layer is 10~20 nm; and only the total thickness of the $In_{0.4}Ga_{0.6}As$ buffer layers is controlled at 10~20 nm, and the growth temperatures are controlled at 350~380° C. and 500~540° C. respectively, can the stress caused by lattice mismatch be reduced, so that the prepared $In_{0.53}Ga_{0.47}As$ has high relaxivity and low residual stress.

The method for preparing the InGaAs film grown on the Si substrate, comprises the steps of:
(1) cleaning a Si substrate;
(2) pre-treating the Si substrate;
(3) removing an oxidation film on the Si substrate;
(4) growing a low temperature $In_{0.4}Ga_{0.6}As$ buffer layer on the Si substrate: an $In_{0.4}Ga_{0.6}As$ buffer layer with a thickness of 4~8 nm is grown in the conditions of the temperature of the Si substrate of 350~380° C., the pressure in the reaction chamber of $7.2 \times 10^{-5} \sim 1.8 \times 10^{-8}$ Pa, the value of V/III of 60~80, and the growth rate of 0.5~1 ML/s;
(5) growing a high temperature $In_{0.4}Ga_{0.6}As$ buffer layer on the low temperature $In_{0.4}G_{0.6}As$ buffer layer: an $In_{0.4}Ga_{0.6}As$ buffer layer with a thickness of 6~12 nm is grown in the conditions of the temperature of the Si substrate of 500~540° C., the pressure in the reaction chamber of $3.0 \times 10^{-5} \sim 2.5 \times 10^{-8}$ pa, the value of V/III of 20~30, and the growth rate of 0.3~0.5 ML/s;
(6) growing an $In_{0.53}Ga_{0.47}As$ epitaxial film on the high temperature $In_{0.4}Ga_{0.6}As$ buffer layer: an $In_{0.53}Ga_{0.47}As$ epitaxial film is grown in the conditions of the temperature of the Si substrate of 550~580° C., the pressure in the reaction chamber of $4.0 \times 10^{-5} \sim 2.7 \times 10^{-8}$ Pa, the value of V/III of 40~60, and the growth rate of 0.6~1 ML/s.

The Si substrate is an n-type Si substrate with a crystal orientation of (111).

In the step (1), cleaning a Si substrate, particularly comprises:
washing with acetone and deionized water to remove the organics on the substrate surface; placing the Si substrate sequentially in $HF:H_2O=1:10$ solution and sonicating for 1~3 minutes, in concentrated $H_2SO_4:H_2O_2:H_2O=4:1:5$ solution and sonicating for 5~10 minutes, in $HF:H_2O=1:10$ solution and sonicating for 1~3 minutes, finally removing the oxides and organics on the surface by washing with deionized water; and blow-drying the cleaned Si substrate with high purity nitrogen.

In step (2), pre-treating the Si substrate, particularly comprises: sending the cleaned Si substrate into the molecular beam epitaxy injection sample chamber to pre-degas for 15~30 minutes; then sending into the transfer chamber at 300~400° C. to degas for 0.5~2 hours, after completion of the degassing, then sending into the growth chamber.

In step (3), removing an oxidation film on the Si substrate, particularly comprises:

sending the Si substrate into the growth chamber, then raising the temperature of the Si substrate to 950~1050° C., baking at the high temperature for 15~30 minutes, and removing the oxidation film layer on the substrate surface.

In step (4), a low temperature $In_{0.4}Ga_{0.6}As$ buffer layer is prepared by a molecular beam epitaxy or metal organic vapor deposition method.

In step (5), a high temperature $In_{0.4}Ga_{0.6}As$ buffer layer is prepared by a molecular beam epitaxy or metal organic vapor deposition method.

In step (6), growing an $In_{0.53}Ga_{0.47}As$ epitaxial film on the high temperature $In_{0.4}Ga_{0.6}As$ buffer layer by a molecular beam epitaxy or metal organic vapor deposition method.

Compared with the prior art, the invention has the following advantages and beneficial effects:

(1) The low temperature/high temperature $In_{0.4}Ga_{0.6}As$ buffer layer technique used in the present invention can effectively filter dislocations between the substrate and the epitaxial layer caused by lattice mismatch, thus releasing the stress properly.

(2) The low temperature/high temperature $In_{0.4}Ga_{0.6}As$ buffer layer used in the present invention can effectively suppress the fluctuations of the interface, and obtain a smooth and flat surface, thus improving the crystal quality of the epitaxial layer of the $In_{0.53}Ga_{0.47}As$ epitaxial film.

(3) As compared with the multilayer buffer layer, the low temperature/high temperature $In_{0.4}Ga_{0.6}As$ double layer buffer layers used in the present invention greatly simplifies the buffer layer structure and the epitaxial growth process, and meets the requirements for strictly controlling the thickness and constituent of the epitaxial layer, thus obtaining an $In_{0.53}Ga_{0.47}As$ epitaxial film with good surface topography, high relaxivity, and high crystal quality.

DETAILED DESCRIPTION

The present invention is further illustrated in detail below in combination with the examples, but the embodiments of the present invention are not limited thereto.

Example 1

The method for preparing an InGaAs film grown on a Si substrate in this example, comprises the steps of:

(1) cleaning the Si substrate: washing with acetone and deionized water to remove the organics on the substrate surface; placing the Si substrate sequentially in $HF:H_2O=1:10$ solution and sonicating for 1 minute, in concentrated $H_2SO_4:H_2O_2:H_2O=4:1:5$ solution and sonicating for 5 minutes, in $HF:H_2O=1:10$ solution and sonicating for 1 minute, finally removing the oxides and organics on the surface by washing with deionized water; and blow-drying the cleaned Si substrate with a high purity nitrogen;

(2) pre-treating the Si substrate: sending the cleaned Si substrate into the molecular beam epitaxy injection sample chamber to pre-degas for 15 minutes; then sending into the transfer chamber at 300° C. to degas for 0.5 hour, after completion of the degassing, then sending into the growth chamber;

(3) removing the oxidation film on the Si substrate; sending the Si substrate into the growth chamber, then raising the temperature of the Si substrate to 950° C., baking at the high temperature for 30 minutes, and removing the oxidation film layer on the substrate surface;

(4) growing a low temperature $In_{0.4}Ga_{0.6}As$ buffer layer on the Si substrate by a molecular beam epitaxy method: an $In_{0.4}Ga_{0.6}As$ buffer layer with a thickness of 4 nm is grown in the conditions of the temperature of the Si substrate of 350° C., the pressure in the reaction chamber of $7.2\times10^{-5}$ Pa, the value of V/III of 60, and the growth rate of 0.5 ML/s;

(5) growing a high temperature $In_{0.4}Ga_{0.6}As$ buffer layer on the low temperature $In_{0.4}Ga_{0.6}As$ buffer layer by a molecular beam epitaxy method: an $In_{0.4}Ga_{0.6}As$ buffer layer with a thickness of 6 nm is grown in the conditions of the temperature of the Si substrate of 500° C., the pressure in the reaction chamber of $3.0\times10^{-5}$ pa, the value of V/III of 20, and the growth rate of 0.3 ML/s;

(6) growing an $In_{0.53}Ga_{0.47}As$ epitaxial film on the high temperature $In_{0.4}Ga_{0.6}As$ buffer layer by a molecular beam epitaxy method: an $In_{0.53}Ga_{0.47}As$ epitaxial film with a thickness of 120 nm is grown in the conditions of the temperature of the Si substrate of 550° C., the pressure in a reaction chamber of $4.0\times10^{-5}$ Pa, the value of V/III of 40, and the growth rate of 0.6 ML/s.

Figure 1:
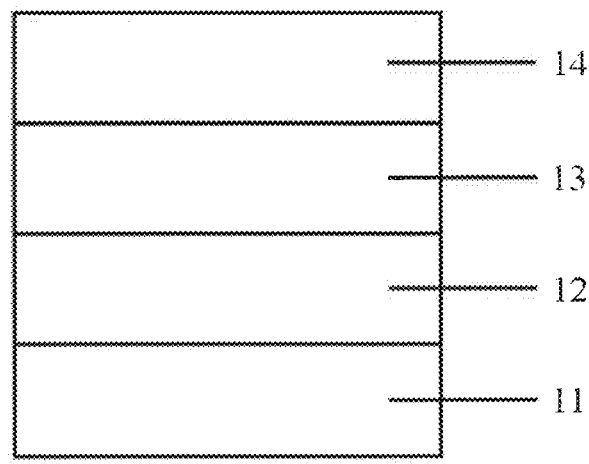
FIG. 1 is a schematic diagram of an InGaAs film grown on a Si substrate according to an example of the present invention.

The InGaAs film grown on the Si substrate prepared in this example is shown in FIG. 1, comprising the Si substrate 11, the low temperature $In_{0.4}Ga_{0.6}As$ buffer layer 12, the high temperature $In_{0.4}Ga_{0.6}As$ buffer layer 13, and the $In_{0.53}Ga_{0.47}As$ epitaxial film 14, arranged sequentially.

Figure 2:
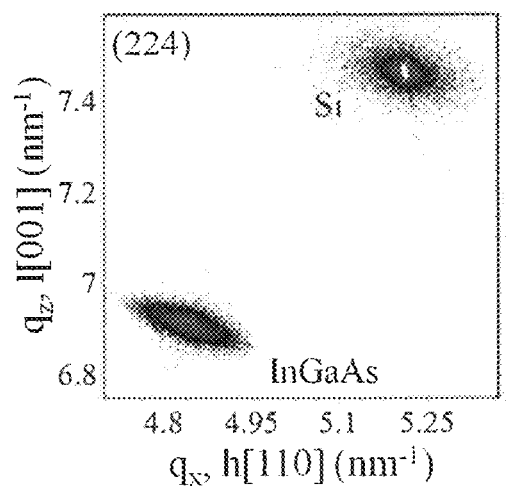
FIG. 2 is a reciprocal space mapping of an InGaAs film grown on a Si substrate according to an example of the present invention.
Figure 3:
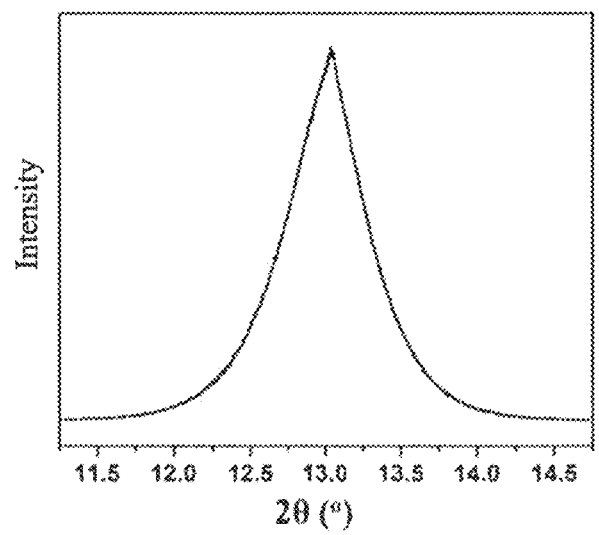
FIG. 3 is a (111) plane X-ray rocking curve of an InGaAs film grown on a Si substrate according to an example of the present invention.

As shown in FIG. 2, the resulting InGaAs film grown on the Si substrate prepared in this example has a relaxivity of up to 95.6%, is in an almost completely relaxed state, and has a full width at half maximum of the (111) plane X-ray rocking curve of 0.6° (as shown FIG. 3), indicating that the stress in the $In_{0.53}Ga_{0.47}As$ epitaxial film is effectively released, and the crystal quality is in a better level as compared with that of the $In_{0.53}Ga_{0.47}As$ film grown on the Si by other methods.

Example 2

The method for preparing an InGaAs film grown on a Si substrate in this example, comprises the steps of (1) cleaning the Si substrate: washing with acetone and deionized water to remove the organics on the substrate surface; placing the Si substrate sequentially in $HF:H_2O=1:10$ solution and sonicating for 3 minutes, in concentrated $H_2SO_4:H_2O_2:H_2O=4:1:5$ solution and sonicating for 10 minutes, in $HF:H_2O=1:10$ solution and sonicating for 3 minutes, finally removing the oxides and organics on the surface by washing with deionized water; and blow-drying the cleaned Si substrate with a high purity nitrogen;

(2) pre-treating the Si substrate: sending the cleaned Si substrate into the molecular beam epitaxy injection sample chamber to pre-degas for 30 minutes; then sending into the transfer chamber at 400° C. to degas for 2 hours, after completion of the degassing, then sending into the growth chamber;

(3) removing the oxidation film on the Si substrate: sending the Si substrate into the growth chamber, then raising the temperature of the Si substrate to 1050° C., baking at the high temperature for 15 minutes, and removing the oxidation film layer on the substrate surface;

(4) growing a low temperature $In_{0.4}Ga_{0.6}As$ buffer layer on the Si substrate by a metal organic vapor deposition method: an $In_{0.4}Ga_{0.6}As$ buffer layer with a thickness of 8 nm is grown in the conditions of the temperature of the Si substrate of 380° C., the pressure in the reaction chamber of $1.8 \times 10^{-8}$ Pa, the value of V/III of 80, the growth rate of 1 ML/s;

(5) growing a high temperature $In_{0.4}Ga_{0.6}As$ buffer layer on the low temperature $In_{0.4}Ga_{0.6}As$ buffer layer by a metal organic vapor deposition method: an $In_{0.4}Ga_{0.6}As$ buffer layer with a thickness of 12 nm is grown in the conditions of the temperature of the Si substrate of 540° C., the pressure in the reaction chamber of $2.5 \times 10^{-8}$ pa, the value of V/III of 20~30, and the growth rate of 0.3~0.5 ML/s;

(6) growing an $In_{0.53}Ga_{0.47}As$ epitaxial film on the high temperature $In_{0.4}Ga_{0.6}As$ buffer layer by a metal organic vapor deposition method: an $In_{0.53}Ga_{0.47}As$ epitaxial films with a thickness of 130 nm is grown in the conditions of the temperature of the Si substrate of 580° C., the pressure in the reaction chamber of $2.7 \times 10^{-8}$ Pa, the value of V/III of 60, and the growth rate of 1 ML/s, The test results of the resulting InGaAs film grown on the Si substrate prepared in this example are similar to those in Example 1, and will not be iterated herein.

The above examples are the preferred embodiments of the present invention, but the embodiments of the present invention are not limited thereto, any changes, modifications, replacements, combinations, and simplifications, all of which being the equivalent replacements, made without departing from the spirit and principle of the present invention, should be encompassed within the scope of the present invention.

The invention claimed is:

1. A method for preparing an InGaAs film grown on a Si substrate, the method comprising:
    cleaning the Si substrate;
    pre-treating the Si substrate;
    removing an oxidation film from a surface of the Si substrate;
    growing a low temperature $In_{0.4}Ga_{0.6}As$ buffer layer on the Si substrate at a temperature in a range of from 350 to 380° C. and under a pressure in a range of from $7.2 \times 10^{-5}$ to $1.8 \times 10^{-8}$ Pa, a V/III ratio being in a range of from 60 to 80, a growth rate being in a range of from 0.5 to 1 ML/s, the low temperature $In_{0.4}Ga_{0.6}As$ buffer layer having a thickness in a range of from 4 to 8 nm;
    growing a high temperature $In_{0.4}Ga_{0.6}As$ buffer layer on the low temperature $In_{0.4}Ga_{0.6}As$ buffer layer at a temperature in a range of from 500 to 540° C. and under a pressure in a range of from $3.0 \times 10^{-5}$ to $2.5 \times 10^{-8}$ Pa, a V/III ratio being in a range of from 20 to 30, a growth rate being in a range of from 0.3 to 0.5 ML/s, the high temperature $In_{0.4}Ga_{0.6}As$ buffer layer having a thickness in a range of from 6 to 12 nm; and
    growing an $In_{0.53}Ga_{0.47}As$ epitaxial film on the high temperature $In_{0.4}Ga_{0.6}As$ buffer layer at a temperature in a range of from 550 to 580° C. and under a pressure in a range of from $4.0 \times 10^{-5}$ to $2.7 \times 10^{-8}$ Pa, a V/III ratio being in a range of from 40 to 60, and a growth rate being in a range of from 0.6 to 1 ML/s;
    wherein:
    the Si substrate, the low temperature $In_{0.4}Ga_{0.6}As$ buffer layer, the high temperature $In_{0.4}Ga_{0.6}As$ buffer layer, and the $In_{0.53}Ga_{0.47}As$ epitaxial film are arranged sequentially; and
    the low temperature $In_{0.4}Ga_{0.6}As$ buffer layer and the high temperature $In_{0.4}Ga_{0.6}As$ buffer layer have a total thickness in a range of from 10 to 20 nm.

2. The method according to claim 1, wherein the substrate is an n-type Si substrate with a crystal orientation of (111).

3. The method according to claim 1, wherein cleaning the Si substrate comprises:
    washing the Si substrate with acetone and deionized water to remove organics from the surface of the substrate;
    placing the Si substrate sequentially in $HF:H_2O=1:10$ solution and sonicating for 1 to 3 minutes, in concentrated $H_2SO_4:H_2O_2:H_2O=4:1:5$ solution and sonicating for 5 to 10 minutes, and in $HF:H_2O=1:10$ solution and sonicating for 1 to 3 minutes;
    then removing oxides and organics from the surface of the substrate by washing with deionized water; and
    blow-drying the cleaned Si substrate with a high purity nitrogen.

4. The method according to claim 1, wherein pre-treating the Si substrate comprises:
    providing the cleaned Si substrate in a molecular beam epitaxy injection sample chamber to subject the substrate to a pre-degassing treatment for 15 to 30 minutes;
    then providing the Si substrate in a transfer chamber to subject the substrate to a degassing treatment at a temperature in a range of from 300 to 400° C. for 0.5 to 2 hours; and
    after completion of the degassing treatment, providing the Si substrate in a growth chamber.

5. The method according to claim 1, wherein removing the oxidation film from the surface of the Si substrate comprises:
    providing the Si substrate in a growth chamber, then raising a temperature of the Si substrate to a temperature in a range of from 950 to 1050° C. baking the substrate at that temperature for 15 to 30 minutes, and removing the oxidation film from the surface of the substrate.

6. The method according to claim 1, wherein the $In_{0.53}Ga_{0.47}As$ epitaxial film is grown on the high temperature $In_{0.4}Ga_{0.6}As$ buffer layer by a molecular beam epitaxy or metal organic vapor deposition method.

* * * * *